United States Patent [19]

Fenk et al.

[11] Patent Number: 4,565,978
[45] Date of Patent: Jan. 21, 1986

[54] INTEGRABLE OSCILLATOR CIRCUIT

[75] Inventors: Josef Fenk, Eching; Richard Stepp, Munich, both of Fed. Rep. of Germany

[73] Assignee: Siemens Aktiengesellschaft, Berlin and Munich, Fed. Rep. of Germany

[21] Appl. No.: 646,005

[22] Filed: Aug. 30, 1984

[30] Foreign Application Priority Data

Sep. 15, 1983 [DE] Fed. Rep. of Germany ....... 3333402

[51] Int. Cl.$^4$ .......................... H03B 5/12; H03C 3/24
[52] U.S. Cl. .......................... 331/117 R; 331/117 FE; 331/177 R; 332/16 T
[58] Field of Search ........ 331/117 R, 117 FE, 116 R, 331/116 FE, 168, 159, 108 D, 177 R; 332/16 T, 29 R

[56] References Cited

U.S. PATENT DOCUMENTS 3,963,996  6/1976  Skerlos ............................ 331/117 R

FOREIGN PATENT DOCUMENTS 2810280  9/1978  Fed. Rep. of Germany ... 331/117 R

Primary Examiner—Siegfried H. Grimm
Attorney, Agent, or Firm—Herbert L. Lerner; Laurence A. Greenberg

[57] ABSTRACT

An integrable bipolar oscillator circuit, includes four transistors of the same conductivity type, four resistors, three constant current sources having base points and outputs, a reference potential terminal connected to the base points of each of the constant current sources, a supply potential terminal, and a frequency-determining feedback member, the output of the first constant current source being connected to the emitter of the first transistor and to the base of the second transistor, the output of the second constant current source being connected to the emitter of the third transistor and to the base of the fourth transistor, the emitters of the second and fourth transistors being connected to the output of the third constant current source through a given connection, the collectors of the first and third transistors being directly connected to the supply potential terminal, the first and second resistors each being connected between a respective one of the collectors of the second and fourth transistors and the supply potential terminal, the fourth resistor being connected between the base of the first transistor and the collector of the fourth transistor, the third resistor being connected between the base of the third transistor and the collector of the second transistor, the frequency-determining feedback member being connected between the base of the third transmitter and the base of the first transistor, and an oscillator voltage being supplied between the emitters of the first and third transistors.

15 Claims, 3 Drawing Figures

INTEGRABLE OSCILLATOR CIRCUIT

The invention relates to an integrable bipolar oscillator circuit formed of bipolar transistors of the same conduction or conductivity type, and resistors.

The devices used to date are based on generally known circuits, such as the Hartley circuit, the Colpitts circuit, the Clapp circuit or the ECO circuit. The conventional circuits for a symmetrical and integrable oscillator operate with low frequency constancy and large oscillation amplitude.

It is accordingly an object of the invention to provide an integrable oscillator circuit which overcomes the hereinbefore-mentioned disadvantages of the heretofore-known devices of this general type, which is different from the known circuits and which reaches its goal with a minimum of circuitry. It is another object to create an FM-modulated oscillator, which does not require capacity diodes.

With the foregoing and other objects in view there is provided, in accordance with the invention, an integrable bipolar oscillator circuit, comprising first, second, third and fourth transistors of the same conductivity type, first, second, third and fourth resistors, first, second and third constant current sources having base points and outputs, a reference potential terminal connected to the base points of the first, second and third constant current sources, a supply potential terminal, and a frequency-determining feedback member, the output of the first constant current source being connected to the emitter of the first transistor and to the base of the second transistor, the output of the second constant current source being connected to the emitter of the third transistor and to the base of the fourth transistor, the emitters of the second and fourth transistors being connected to the output of the third constant current source through a given connection, the collectors of the first and third transistors being directly connected to the supply potential terminal, the first and second resistors each being connected between a respective one of the collectors of the second and fourth transistors and the supply potential terminal, the fourth resistor being connected between the base of the first transistor and the collector of the fourth transistor, the third resistor being connected between the base of the third transistor and the collector of the second transistor, the frequency-determining feedback member being connected between the base of the third transistor and the base of the first transistor, and an oscillator voltage being supplied between the emitter of the first and third transistors.

In accordance with another feature of the invention, the feedback member is a resonant circuit.

In accordance with a further feature of the invention, there is provided at least one capacitor, fifth through tenth transistors, fifth through tenth resistors, and fourth through sixth constant current sources each having a base point connected to the reference potential terminal and an output, the fifth transistor being connected in the given connection with the emitter of the fifth transistor connected to the output of the third constant current source and the collector of the fifth transistor connected to the emitter of the second and fourth transistors, the fifth resistor being connected between the emitter of the fifth transistor and a common connection of the emitter of the sixth transistor and the output of the fourth constant current source, the base of the seventh transistor having an input connected thereto for receiving an LF (NF) signal, the base of the eighth transistor having an input connected thereto for receiving a reference voltage, the emitter of the seventh transistor being connected to the output of the fifth constant current source and to the base of the fifth transistor, the emitter of the eighth transistor being connected to the output of the sixth constant current source and to the base of the sixth transistor, the collectors of the seventh and eighth transistors being connected directly to the supply potential terminal, the collector of the sixth transistor being connected directly to the emitters of the ninth and tenth transistors, the sixth and seventh resistors being load resistors and each being connected between the collector of a respective one of the ninth and tenth transistors and the supply potential terminal, the eighth transistor being connected between the collector of the ninth transistor and the base of the third transistor, the ninth resistor being connected between the collector of the tenth transistor and the base of the first transistor, a capacity represented by the at least one capacitor being connected between the collectors of the ninth and tenth transtors, and the tenth resistor being connected between the collectors of the second and fourth transistors.

In accordance with an added feature of the invention, each of the constant current sources are in the form of a transistor of the same conductivity type as the other transistors and connected as a constant current source.

In accordance with an additional feature of the invention, the transistors are of the npn-type.

In accordance with again another feature of the invention, there is provided a common reference potential source, first and second cascode transistors for furnishing an oscillator signal, and first and second additional resistors, the first resistor being a load resistor of the first transistor having a first end connected to the second transistor and a second end, the second transistor being a load resistor of the fourth transistor having a first end connected to the fourth transistor and a second end, the emitter of the first cascode transistor being connected to the second end of the first resistor, the emitter of the second cascode transistor being connected to the second end of the second resistor, the bases of the cascode transistors being connected to the common reference potential source, and each of the first and second additional resistors being connected between the collector of a respective one of the cascode transistors and the supply potential terminal, providing the exclusive connections between the first and second load resistors and the supply potential terminal for generating the oscillator signal between the collectors of the cascode transistors.

In accordance with a concomitant feature of the invention, the transistors are MOS field-effect transistors of the self-latching type.

Other features which are considered as characteristic for the invention are set forth in the appended claims.

Although the invention is illustrated and described herein as embodied in an integrable oscillator circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

Figure 1:
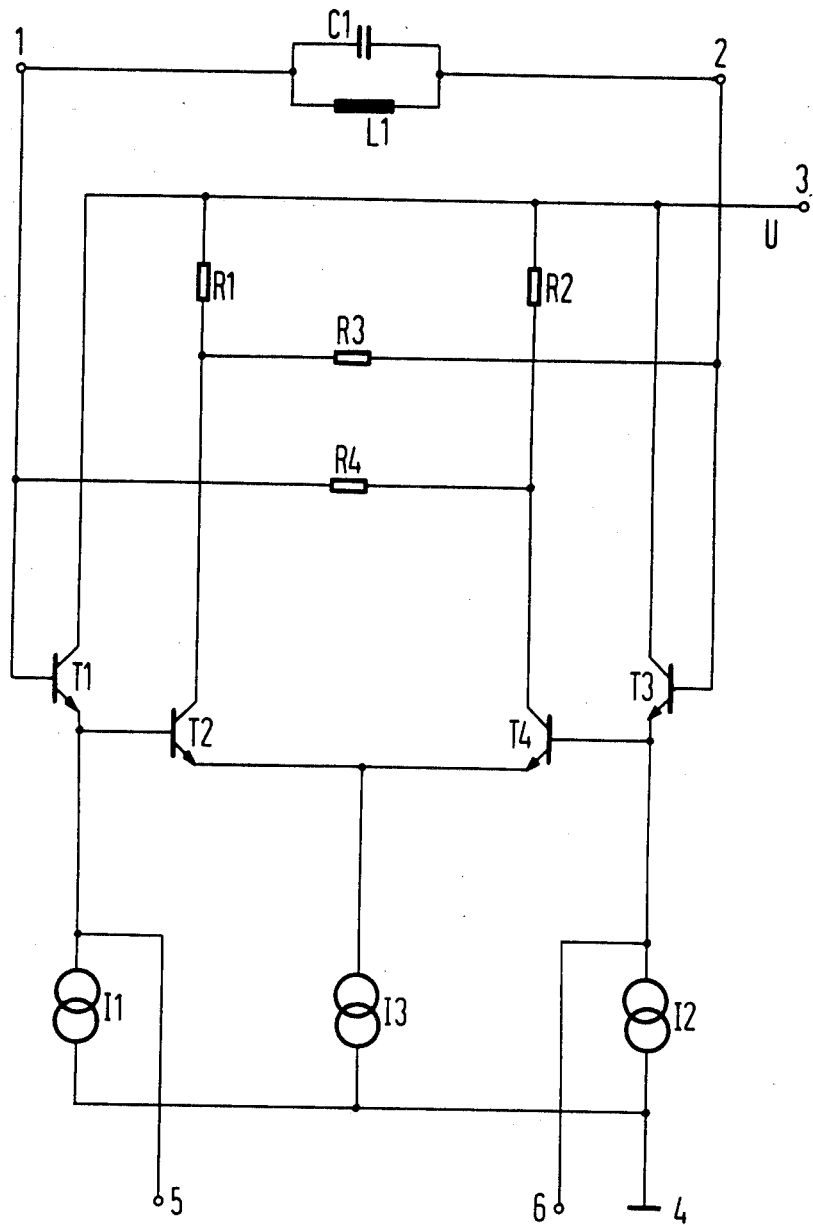
FIG. 1 is a schematic circuit diagram of a circuit for the oscillator according to the invention.

Referring now to the figures of the drawing in detail and first particularly to the oscillator circuit shown in FIG. 1, there is seen a first transistor T1 connected with its emitter to the base of a second transistor T2 as well as to the output of a first constant-current source I1. On the other hand, a third transistor T3 is connected to the base of a fourth transistor T4 and in addition to the output of a second constant-current source I2. The emitter of the second transistor T2 and the emitter of the fourth transistor T4 are jointly fed by the output of a third constant-current source I3. Each of the constant-current sources may be a transistor connected in a current source circuit or a current reflector. The base points of the three identical constant-current sources I1, I2 and I3 are connected to a terminal 4 for the reference potential. The transistors T1 to T4 which are shown in the illustrated embodiment according to FIG. 1 and preferably used in practice, are npn-transistors, as are the transistors in the constant-current sources.

The collector of the first transistor T1 as well as the collector of the third transistor T3 are connected directly to a terminal 3 for a supply potential $U_{Batt}$, while resistors R1 and R2 are respectively inserted between the collector of the second transistor T2 and the terminal 3 as well as between the collector of the fourth transistor T4 and the terminal 3. The two resistors R1 and R2 are identical. In addition, the base of the first transistor T1 is connected to a terminal 1 and the base of the third transistor T3 is connected to a further terminal 2. A frequency-determining member is connected between the two terminals 1 and 2. For example, in the illustrated embodiment a resonant circuit which is formed of a capacitor C1 and an inductance L1, is used. Finally, a resistor R3 forms a connection between the collector of the second transistor T2 and the base of the third transistor T3, and a resistor R4 forms a connection between the collector of the fourth transistor T4 and the base of the first transistor T1. For reasons of symmetry, the resistors R3 and R4 are preferably equal as well. The oscillator signal can be taken off between the emitter of the first transistor T1 and the emitter of the third transistor T3, i.e., at outputs 5 and 6.

Thus, the amplifier part of the oscillator according to the invention is formed of the two transistors T2 and T4, (i.e., the second and the fourth transistors) with their emitters connected to the third current source I3, and the two load resistors R1 and R2. The third current source I3 supplies the emitter current for this amplifier stage. The two emitter followers T1 and T3 control the base terminals of the amplifier T2, T4 and increase the input impedance of this stage, so that the resonant circuit C1, L1 connected to the terminals 1 and 2 is damped less than if these emitter follower stages T1 and T3 were not present.

A symmetrical, in-phase feedback to the amplifier inputs is accomplished by the resistors R3 and R4, and is provided at the base terminals of the transistors T1 and T3. If a resonant circuit C1, L1 is connected to the terminals 1 and 2, the above-described circuit oscillates approximately at the center frequency of the resonant frequency if the phase shift of the amplifier can be neglected. If the Q of the resonant circuit is high enough, a loop gain k=1 can adjust itself. The oscillation is then maintained. The maximum amplitude of the oscillation occurs through the limitation at the input characteristic of the differential amplifier. The oscillator signal can be taken off with little reaction and with little harmonic content, at the terminals 5 and 6.

However, the oscillator signal can also be taken off by means of cascode transistors between the load resistors R1, R2 and the supply terminal 3 for the supply potential $U_{Batt}$. This capability will be described further in greater detail with reference to FIG. 1a.

The symmetrical oscillator circuit described and illustrated in FIG. 1 can also be modified so as to be asymmetrical by selectively and capacitively referring the terminal 1 or 2 to ground (i.e., to the reference potential at terminal 4). As mentioned above, the terminals 1 and 2 are connected to the resonant circuit. The terminal is referred to ground by providing a non-illustrated additional capacitor through which one of the ends of the resonant circuit C1, L1 is connected to ground. Finally, the resonant circuit C1, L1 can also be replaced by a resonant quartz crystal.

It is therefore essential for the invention that:

(a) the resonant circuit is connected to the high-impedance input 1, 2 of the amplifier and the signal feedback is provided through likewise high-impedance feedback resistors R3, R4. The two feedback resistors R3 and R4 are advantageously constructed in such a way that the high Q of the resonant circuit is not unnecessarily strongly damped, while the load resistors R1 and R2 are adjusted to a low value adapted to the respective operating frequency;

(b) the oscillation amplitude is limited to relatively low voltage values at the resonant circuit, i.e., to approximately 200 mV$_{p-p}$, which is accomplished by dividing the oscillation amplitude at the load resistors R1, R2 through the high-resistance feedback resistors R3, R4;

(c) high frequency stability and spectral purity through a high operating Q of the resonant circuit (suppression of harmonics) are obtained; and (d) far-reaching independence of the frequency of the oscillations furnished by the oscillator from the temperature is assured in the normal range of use for integrated circuits through appropriate temperature gradients of the impressed current.

Figure 1A:
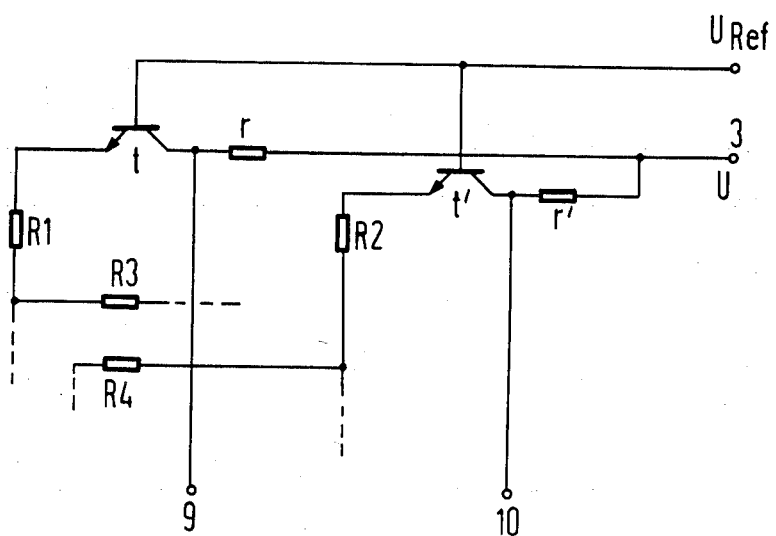
FIG. 1a is a diagram of a circuit for supplementing the circuit of FIG. 1.

The oscillator circuit shown in FIG. 1 can be supplemented, as already mentioned, in the manner shown in FIG. 1a.

For this purpose, the end of the corresponding load resistor R1 facing away from the second transistor T2 and the feedback resistor R3, which will be called the "other" end, is not connected directly to the terminal 3 for the supply potential $U_{Batt}$. The same applies for the "other" end of the load resistor R2 facing away from the fourth transistor T4 and the feedback resistor R4. Rather, as can be seen from FIG. 1a, the other end of the resistor R1 is connected to the emitter of a cascode transistor t, which is of the same type as the transistors T1 to T4. By the same token, a cascode transistor t' is provided with an emitter which is connected to the other end of the other load resistor R2. The base terminals of the two transistors t and t' are acted upon by a common reference potential $U_{Ref}$, while the collectors thereof are each connected through a respective resistor r or r' to the supply terminal 3. Each of the collectors of the two cascode transistors t and t' are also connected to a respective output terminal 9 or 10. The oscillator signal can likewise be taken off at the two output terminals 9 and 10.

As already indicated, an oscillator circuit according to the invention can be extended to form an FM oscillator which can be modulated without the aid of capacity diodes. The additions to the circuit according to FIG. 1 (or FIG. 1a) required therefor, can be seen from FIG. 2. This circuit will now be described and its operation explained.

It should first be noted at this point that, contrary to FIG. 1, the connection between the emitter of the second transistor T2 and the fourth transistor T4 to the output of the third constant-current source I3 is not a direct connection, but is accomplished through the emitter-collector path of a fifth transistor T5. The emitter of the fifth transistor T5 is connected to the output of the third current source I3 and, in addition, is connected through a fifth resistor R5 to the emitter of a sixth transistor T6 as well as to the output of a fourth constant current source I4. It is also noted in this connection that in this case as well, the base points of the current sources are connected to the terminal 4 for the reference potential (ground).

A seventh terminal 7 serves as the LF-input and is represented by the base electrode of a seventh transistor T7, the collector of which is connected to terminal 3 for the supply potential $U_{Batt}$. The emitter of the transistor T7 is connected to the output of a fifth current source I5 and is furthermore connected to the base of the fifth transistors T5. A further terminal 8, which can be acted upon by a reference potential $U_{ref}$, is connected to the base of an eighth transistor T8, the collector of which is likewise connected directly to the terminal 3 for the supply potential. The emitter of the transistor T8 is connected on one hand, to the base of the sixth transistor T6 and on the other hand, to the output of a sixth current source I6.

The collector of the sixth transistor T6 leads directly to the emitter of two further transistors T9 and T10. The base of the ninth transistor T9 is connected to the emitter of the first transistor T1 and the base of the tenth transistor T10 is connected to the emitter of the third transistor T3. A connection through a load resistor R6 is disposed between the collector of the ninth transistor T9 and the terminal 3 for the supply potential $U_{Batt}$. A connection through a load resistor R7 is similarly disposed between the collector of the tenth transistor T10 and the terminal 3 for the supply potential. Finally, at least one capacitive connection which in the illustrated embodiment is formed of a capacitor C2, is provided between the collectors of the two transistors T9 and T10. A further resistor R8 forms a connection between the collector of the ninth transistor T9 and the base of the third transistor T3. Likewise, a connection is provided by means of a resistor R9 between the collector of the tenth transistor T10 and the base of the first transistor. Finally, a tenth resistor R10 connects the collector of the second transistor T2 to the collector of the fourth transistor T4.

Figure 2:
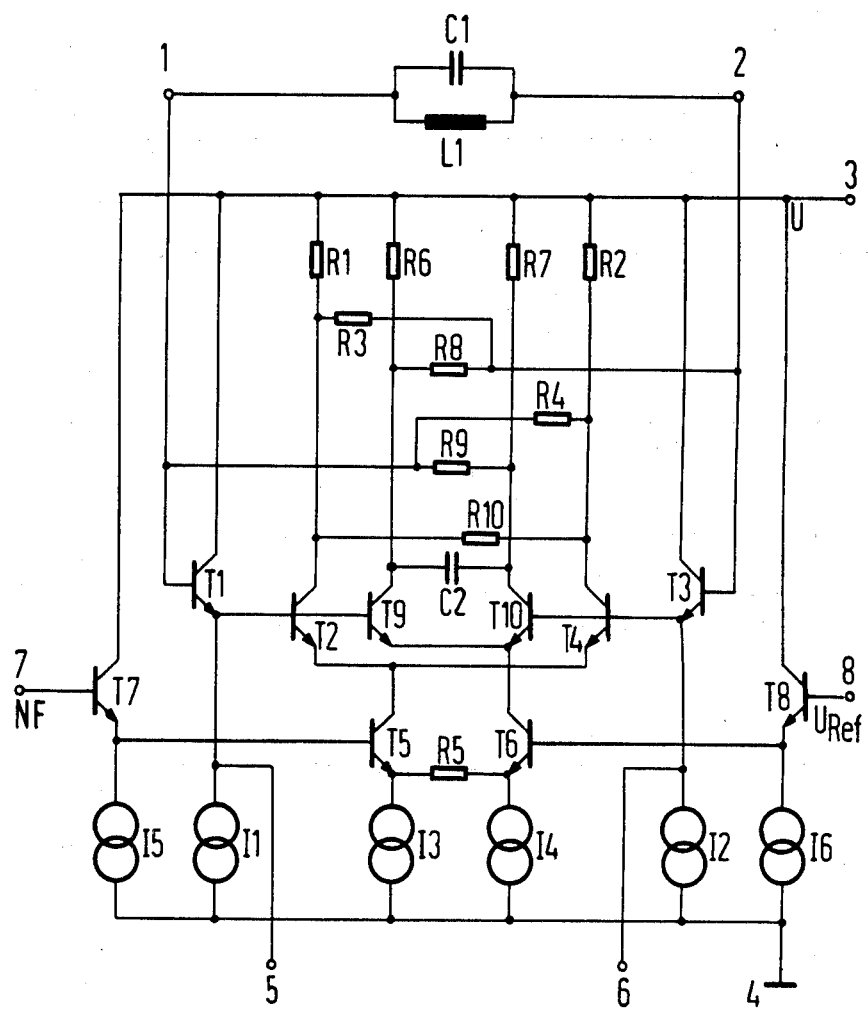
FIG. 2 is a diagram of another embodiment of the circuit for achieving FM-modulation.

As may be seen directly from the circuit diagram shown in FIG. 2, the oscillator proper is formed of the transistors T1, T2, T9, T10, T4, T3, the resistors R1 to R4 and R6 to R9. The oscillator also contains the inductance L1 and the capacitor C1 of the resonant circuit between the terminals 1 and 2 as well as the capacity C2 between the collectors of the transistors T9 and T10.

If the terminal 7 (the LF input) is substantially more positive than the reference point (terminal 8) and if the above-mentioned transistors are all of the npn-type as in the case shown, then current impressed by the current sources I3, I4 on the transistors T5 and T6 flows completely through the collector of the transistor T5 into the emitters of the emitter-coupled differential-amplifier stage T2, T4. Thus, this amplifier stage operates with maximum again. The frequency-determining elements C1, L1 proper are connected to the terminals 1 and 2. The base terminals of the transistors T2 and T9 and of the transistors T4 and T10 are each addressed through the emitter of a respective one of the two transistors T1, T3 operating as emitter followers. Only the two transistors T2 and T4 are active under the conditions just mentioned above. The amplified signal is present at the resistors R10 and R1 or R10 and R2, respectively. This signal is fed-back in-phase through the resistors R3 and R4 to the inputs 1 and 2 and thus to the resonant circuit C1, L1. If the amplifier itself has no appreciable phase shift, then the oscillator oscillates at the center frequency of the resonant circuit C1, L1, the oscillation amplitude being determined by the limitation of the input characteristic of the differential amplifier. The signal furnished by the oscillator at the terminals 5 and 6, i.e., at the emitters of the transistors T1 and T3, can be taken off with little reaction and with high spectral purity, since it is derived directly from the resonant circuit L1, C1.

If, on the other hand, the potential at the LF input terminal 7 is substantially more negative than the potential at the reference input 8, then the current flows from the current sources I3, I4 completely into the second emitter-coupled differential amplifier stage T9, T10 through the collector of transistor T6. The complex load impedance of this differential stage T9, T10 is formed of the resistors R6, R7 and the capacitor C2. Through appropriate adjustment of the individual elements forming the load impedance, it is adjusted so that it has the same magnitude as the load resistance at the differential stage formed by the transistors T2 and T4. However, a phase angle of, for instance, $-45°$ is fixed permanently, due to the presence of the capacitor C2. It is a condition for the oscillation of the oscillator that the transmission phase in the closed circuit of the oscillator circuit has the value zero and the normalized amplitude value is larger than or equal to 1. In order to cause the phase to become 0° overall, an oscillating frequency must adjust itself in such a way that the parallel resonance circuit is 45° below the resonance frequency, as far as the phase curve is concerned. Due to the conditions described above, a change in the oscillator frequency is achieved and therefore, FM modulation is possible, through a d-c or a-c voltage applied to the terminal 7.

The values for the resistors of the circuit shown in FIGS. 1 and 2 can be set, for instance, as follows:
R1=2 kΩ; R2=2 kΩ; R3=10 kΩ; R4=10 kΩ; R5=4 kΩ; R6=2 kΩ; R7=2 kΩ; R8=10 kΩ; R9=10 kΩ; R10=4 kΩ; r=r'=2 kΩ;

For the capacitor C2, a capacity value of, for instance, $C1=(\omega.R10)^{-1}=7$ pF for 5.5 MHz, is advisable.

Instead of npn-transistors, pnp-transistors could also be used.

For well known reasons, however, the above-described embodiment with npn-transistors is more advantageous.

In the oscillator circuit shown in FIG. 2 according to the invention, the following is therefore essential:

(1) The oscillator includes two amplifier stages T2, T4 and T9, T10, while the basic form of the invention shown in FIG. 1 has only one such amplifier stage, namely T2, T4. It is therefore possible, in the oscillator circuit according to FIG. 2, to change the frequency by controlling the current in these two stages.

(2) The LF signal is not fed-in in the HF signal path, so that mutual influence does not occur between the HF path and the LF path.

(3) The FM-modulated HF signal can be taken off with little reaction and little harmonic content at the terminals 5, 6 (or 9, 10 in FIG. 1a).

(4) The modulation only has very little distortion,

It may be seen without difficulty that the circuit according to FIG. 1 as well as the circuit according to FIG. 2 can be integrated monolithically without difficulty (while omitting at most the resonant circuit L1, C1). Finally, the transistors used in the circuit can also be replaced by field-effect transistors, particularly by self-latching MOS field-effect transistors of the n-channel type, for instance.

The foregoing is a description corresponding in substance to German application No. P 33 33 402.1, filed Sept. 15, 1983, the International priority of which is being claimed for the instant application, and which is hereby made part of this application. Any material discrepancies between the foregoing specification and the aforementioned corresponding German application are to be resolved in favor of the latter.

We claim:

1. Integrable bipolar oscillator circuit, comprising first, second, third and fourth transistors of the same conductivity type, first, second, third and fourth resistors, first, second and third constant current sources having base points and outputs, a reference potential terminal connected to said base points of said first, second and third constant current sources, a supply potential terminal, and a frequency-determining feedback member, said output of said first constant current source being connected to the emitter of said first transistor and to the base of said second transistor, said output of said second constant current source being connected to the emitter of said third transistor and to the base of said fourth transistor, the emitters of said second and fourth transistors being connected to said output of said third constant current source through a given connection, the collectors of said first and third transistors being directly connected to said supply potential terminal, said first and second resistors each being connected between a respective one of the collectors of said second and fourth transistors and said supply potential terminal, said fourth resistor being connected between the base of said first transistor and the collector of said fourth transistor, said third resistor being connected between the base of said third transistor and the collector of said second transistor, said frequency-determining feedback member being connected between the base of said third transistor and the base of said first transistor, and an oscillator voltage being supplied between the emitters of said first and third transistors.

2. Oscillator circuit according to claim 1, wherein said feedback member is a resonant circuit.

3. Oscillator circuit according to claim 2, including at least one capacitor, fifth through tenth transistors, fifth through tenth resistors, and fourth through sixth constant current sources each having a base point connected to said reference potential terminal and an output, said fifth transistor being connected in said given connection with the emitter of said fifth transistor connected to said output of said third constant current source and the collector of said fifth transistor connected to the emitters of said second and fourth transistors, said fifth resistor being connected between the emitter of said fifth transistor and a common connection of the emitter of said sixth transistor and said output of said fourth constant current source, the base of said seventh transistor having an input connected thereto for receiving an LF signal, the base of said eighth transistor having an input connected thereto for receiving a reference voltage, the emitter of said seventh transistor being connected to said output of said fifth constant current source and to the base of said fifth transistor, the emitter of said eighth transistor being connected to said output of said sixth constant current source and to the base of said sixth transistor, the collectors of said seventh and eighth transistors being connected directly to said supply potentiaal terminal, the collector of said sixth transistor being connected directly to the emitters of said ninth and tenth transistors, said sixth and seventh resistors being load resistors and each being connected between the collector of a respective one of said ninth and tenth transistors and said supply potential terminal, said eighth resistor being connected between the collector of said ninth transistor and the base of said third transistor, said ninth resistor being connected between the collector of said tenth transistor and the base of said first transistor, said at least one capacitor being connected between the collectors of said ninth and tenth transistor, and said tenth resistor being connected between the collectors of said second and fourth transistors.

4. Oscillator according to claim 2, wherein each of said constant current sources are in the form of a transistor of the same conductivity type as the other transistors and connected as a constant current source.

5. Oscillator according to claim 3, wherein each of said constant current sources are in the form of a transistor of the same conductivity type as the other transistors and connected as a constant current source.

6. Oscillator according to claim 2, wherein said transistors are of the npn-type.

7. Oscillator according to claim 3, wherein said transistors are of the npn-type.

8. Oscillator according to claim 4, wherein said transistors are of the npn-type.

9. Oscillator according to claim 5, wherein said transistors are of the npn-type.

10. Oscillator according to claim 2, including a common reference potential source, first and second cascode transistors for furnishing an oscillator signal, and first and second additional resistors, said first resistor being a load resistor of said second transistor having a first end connected to said second transistor and a second end, said second resistor being a load resistor of said fourth transistor having a first end connected to said fourth transistor and a second end, the emitter of said first cascode transistor being connected to said second end of said first resistor, the emitter of said second cascode transistor being connected to said second end of said second resistor, the bases of said cascode transistors being connected to said common reference potential source, and each of said first and second additional resistors being connected between the collector of a respective one of said cascode transistors and said supply potential terminal, providing the exclusive connections between said first and second load resistors and said supply potential terminal for generating the oscillator signal between the collectors of said cascode transistors.

11. Oscillator according to claim 3, including a common reference potential source, first and second cascode transistors for furnishing an oscillator signal, and first and second additional resistor, said first resistor being a load resistor of said second transistor having a first end connected to said second transistor and a second end, said second resistor being a load resistor of said fourth transistor having a first end connected to said fourth transistor and a second end, the emitter of said first cascode transistor being connected to said second end of said first resistor, the emitter of said second cascode transistor being connected to said second end of said second resistor, the bases of said cascode transistors being connected to said common reference potential source, and each of said first and second additional resistors being connected between the collector of a respective one of said cascode transistors and said supply potential terminal, providing the exclusive connections between said first and second load resistors and said supply potential terminal for generating the oscillator signal between the collectors of said cascode transistors.

12. Oscillator according to claim 2, wherein said transistors are MOS field-effect transistors of the self-latching type.

13. Oscillator according to claim 3, wherein said transistors are MOS field-effect transistors of the self-latching type.

14. Oscillator according to claim 10, wherein said transistors are MOS field-effect transistors of the self-latching type.

15. Oscillator according to claim 11, wherein said transistors are MOS field-effect transistors of the self-latching type.

* * * * *